United States Patent [19]

Fitzsimmons

[11] Patent Number: 4,789,408

[45] Date of Patent: Dec. 6, 1988

[54] SOLAR COLLECTOR

[76] Inventor: James W. Fitzsimmons, 4 Bainbridge Ave., Melville, N.Y. 11747

[21] Appl. No.: 934,857

[22] Filed: Nov. 25, 1986

[51] Int. Cl.⁴ ............................................. H02N 6/00
[52] U.S. Cl. .................................... 136/246; 136/259
[58] Field of Search ................................. 136/246, 259

[56] References Cited

U.S. PATENT DOCUMENTS

| | | | |
|---|---|---|---|
| 3,450,890 | 6/1969 | Skorup | 250/227 |
| 3,758,197 | 9/1973 | Klang et al. | 350/286 |
| 4,074,704 | 2/1978 | Gellert | 126/440 |
| 4,118,249 | 10/1978 | Graven et al. | 136/246 |
| 4,127,425 | 11/1978 | Chambers | 136/247 |
| 4,131,485 | 12/1978 | Meinel et al. | 136/259 |
| 4,140,544 | 2/1979 | Sill | 136/247 |
| 4,298,802 | 11/1981 | Quella et al. | 250/484 |
| 4,519,384 | 5/1985 | Murtha | 126/438 |
| 4,594,470 | 6/1986 | Headrick | 136/246 |

FOREIGN PATENT DOCUMENTS

| | | | |
|---|---|---|---|
| 2827708 | 6/1977 | Fed. Rep. of Germany | 136/246 |
| 2907424 | 8/1980 | Fed. Rep. of Germany | 136/246 |
| 2400261 | 8/1977 | France | 136/246 |

Primary Examiner—Aaron Weisstuch
Attorney, Agent, or Firm—Larson and Taylor

[57] ABSTRACT

A solar collection device and method including a corrugated front surface and a plurality of fins for refracting and concentrating solar radiation on a photovoltaic cell. The device uses a clear material to refract and concentrate solar radiation and conductively cool the system. A modular system of solar collecting devices which employs a plurality of devices connected to one another to provide a large power output, simple assembly, replaceability, and expandibility is also disclosed.

20 Claims, 4 Drawing Sheets

SOLAR COLLECTOR

FIELD OF THE INVENTION

The present invention relates to photovoltaic devices for converting solar radiation to electrical energy.

BACKGROUND OF THE INVENTION

Present solar collectors include collectors that concentrate a large amount of solar radiation onto a small photovoltaic cell. Many of these units require active tracking devices to track the sun in order to generate a sufficient amount of energy. Most collectors are large and bulky thereby making them difficult to install and repair. Further, the majority of collectors are expensive and cannot be expanded without purchasing a second large unit at great cost to the purchaser.

An example of a prior art concentrator is shown in U.S. Pat. No. 3,450,890 (Skorup). This device will only collect a limited amount of solar radiation in comparison to the device of of the present invention. Also, this device will be heavy since it comprises a solid piece of material. Other devices of the prior art are shown by U.S. Pat. No. 4,140,544 (Sill); U.S. Pat. No. 4,127,425 (Chambers); U.S. Pat. No. 4,298,802 (Quella et al); and German Pat. No. 2,827,708. These collectors all concentrate solar radiation by trapping it in a wedge-shaped member. Additionally, some of them employ luminescent surfaces to absorb the radiation and reradiate it. The present invention does not require luminescent materials.

There is a need in the art for a lightweight solar collection device that is efficient and inexpensive. In addition, prior art devices lack the ability to be expanded cheaply and cannot be updated readily to employ new technology as it develops. The present invention accomplishes these and other objectives.

SUMMARY OF THE INVENTION

The present invention relates to a photovoltaic device for converting solar radiation to electrical energy comprising a collector member having two side edges, a top end, a bottom end, a front side which comprises a corrugated surface that serves to refract radiation, a rear side which comprises a plurality of fins protruding outwardly from said collector member, said front and rear sides acting in cooperation to refract and concentrate radiation, and at least one photovoltaic cell being adapted to receive and convert solar radiation to electrical energy mounted at one end of said collector member in a position such that at least some of the radiation refracted and concentrated by said collector member will impinge on said photovoltaic cell.

The present invention also encompasses the use of a reflective surface to prevent escape of solar radiation from the collector member and to reflect solar radiation not directly impinging on the collector member so that it will impinge on the collector member. In addition, the present invention embodies the use of a pair of triangular light refracting members which will refract solar radiation which would miss the collector member such that this additional radiation will impinge on the collector member.

The present invention also includes a modular system for converting solar radiation to electrical energy which embodies the photovoltaic device of the present invention. The modular system comprises an external frame, a plurality of attachment members attached to the external frame, means for connecting the collector members to each other both physically and electrically, and apertures in the attachment members into which the photovoltaic devices are releasably inserted. The system also includes a plurality of photovoltaic devices and a means for electrically connecting the photovoltaic cells to each other. The modular system allows for failure of one or more units without breakdown of the entire system. The system also provides the flexibility to replace individual units, add or remove units, or replace outdated units with state-of-the art units which may be developed. The modular system may also include the reflective sheets and triangular members mentioned previously to further increase the efficiency and output of the system. Also, in a preferred embodiment the external frame is pivotally mounted to allow for angular adjustment of the system to the optimal angle for intake of solar radiation.

Additionally, the present invention comprises a method of using the photovoltaic device to convert solar radiation to electrical energy. The method includes mounting at least one photovoltaic device in a position where solar radiation will impinge on its front face and electrically connecting the photovoltaic device to an apparatus which consumes or stores electricity. The method may also incude the added steps of positioning the photovoltaic devices to face in a desired direction, adding reflective sheets to increase efficiency and output, and adding triangular members to refract additional radiation onto the front face of the photovoltaic devices.

It is an object of the present invention to provide a simple, lightweight and inexpensive photovoltaic device that is easy to manufacture.

It is a further object of the present invention to provide a passive photovoltaic device with an exceptionally good energy output.

It is a further object of the present invention to provide a photovoltaic device that achieves a high concentration of solar energy and yet does not require an active cooling system.

It is a further object of the present invention to provide a modular solar collection system which may be expanded at any time by simply adding units.

It is a further object of the present invention to provide a modular solar collection system wherein failure of one or more units will not cause complete shutdown of the system.

It is a further object of the present invention to provide a modular solar collection system which may be updated simply by replacing outdated units with modern units.

It is a still further object of the present invention to provide a solar collection system which can be installed by the consumer without difficulty.

These and other objects and advantages of the invention will be apparent from the following detailed description.

DETAILED DESCRIPTION OF THE PREFERRED EMBODIMENT

Figure 1:
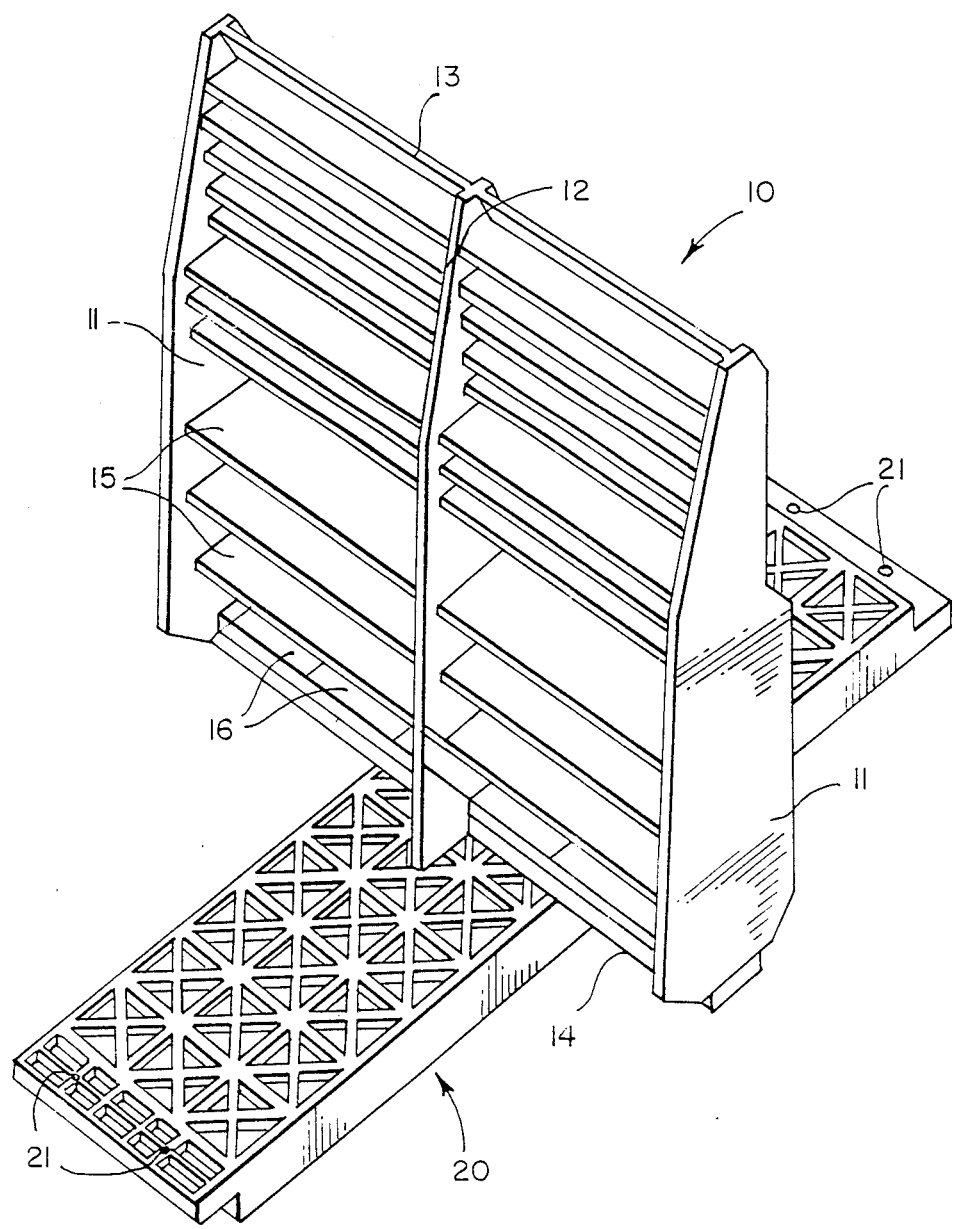
FIG. 1 is a perspective view of a collector member from the rear side attached to an attachment member.

Referring to FIG. 1, the collector member 10 includes side edges 11 which support the collector member 10. The collector member 10 also includes a central support 12 which provides additional support and strength to the collector member 10. The collector member 10 includes a top 13 and a bottom 14. The rear side of the collector member 10 also includes a plurality of fins 15 attached to the side edges 11 and the central support 12. These fins 15 serve at least two purposes. First, solar radiation which impinges on the front side will be refracted such that most of the radiation will impinge on the fins 15. This radiation will be refracted and concentrated by the fins 15 onto the photovoltaic cells 16. A second purpose of the fins 15 is to provide cooling of the collector member 10. A substantial amount of heat is generated by the solar radiation in the collector member 10 and these fins 15 increase the surface area for conductive heat loss and thereby aid in cooling the system. Another important advantage resulting from the use of fins 15 is that construction of the collector member 10 requires less raw material than a solid collector since there is substantial air space between the fins 15.

Also shown in FIG. 1 is the attachment member 20. The attachment member 20 includes holes 21 at either end for mechanical fasteners. The attachment members 20 are adapted to fit together at their ends and are preferably attached to each other by mechanical fasteners. In this manner a series of attachment members 20 may be connected end to end to position the collector members 10 in a linear fashion, which is the optimal position for maximum collection of solar radiation. The attachment member 20 also includes an aperture (not shown) into which the central support 12 fits. The central support 12 is shown engaged in the aperture in FIG. 1.

Figure 2:
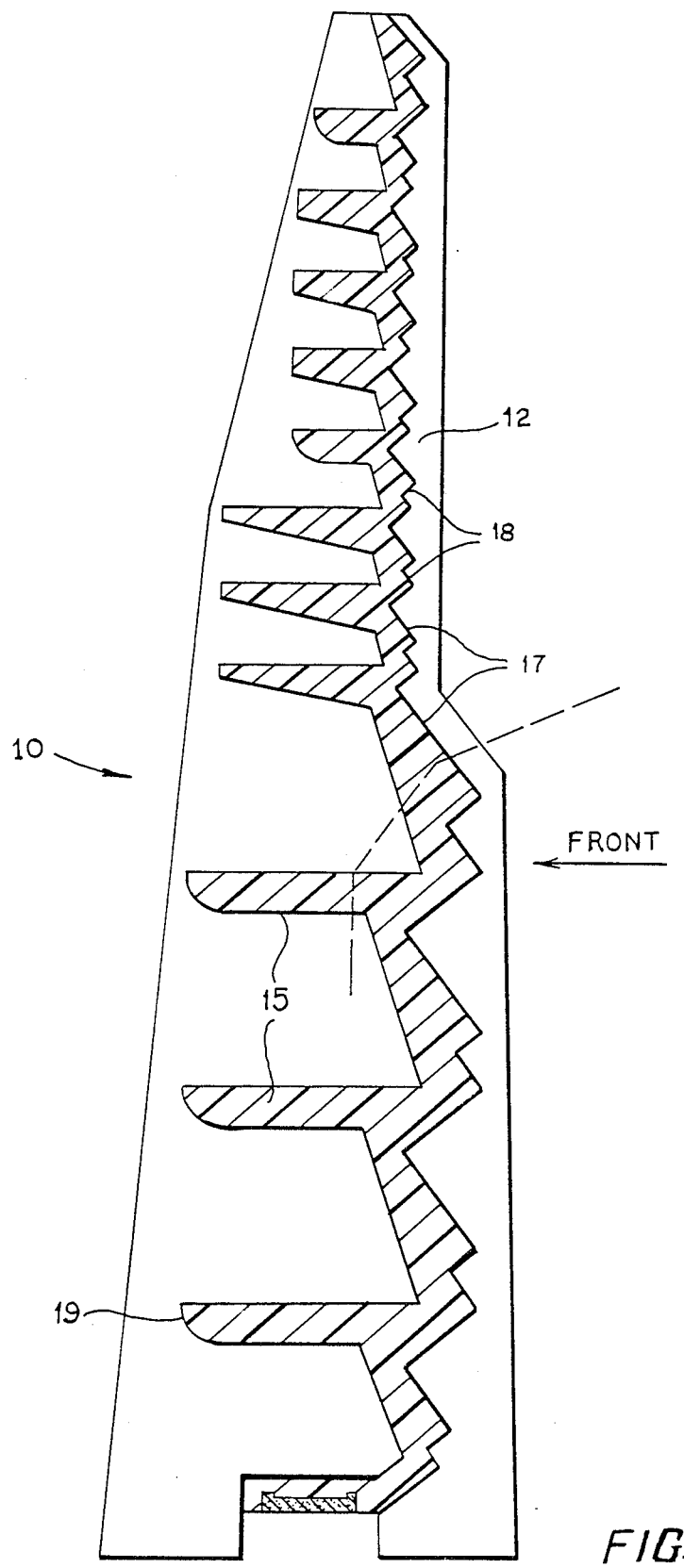
FIG. 2 depicts a cross sectional view of the collector member.

Referring now to FIG. 2 the collector member 10 is shown in cross-section with the front face being indicated by an arrow. The front face is corrugated. Impinging radiation will contact the refractive surfaces 17 of the front face and be refracted as shown by the dotted line in FIG. 2. The front face also includes slots 18 which are cut out of the front face. These slots 18 are present simply to minimize the amount of material needed to fabricate the collector member 10. Any radiation impinging on the slots 18 will still impinge on one of the fins 14 so there is no loss of effectiveness due to the presence of the slots 18. Radiation impinging on the fins 15 is refracted in the direction indicated by the dotted line in FIG. 2 and is caused to impinge on the photovoltaic cell 16. The photovoltaic cells 16 are made from silicon. Each collector member 10 preferably includes a string of four (4) silicon photovoltaic cells connected in parallel. Each of these cells is one half inch by two and one half inches. When the collector members 10 are constructed in the factory, the collector member 10 will be injection molded. A Lexan tray which becomes part of the collector member 10, is also molded. This tray contains a layer of foam material or other soft material. The silicon photovoltaic cells 16 are laid on top of the foam. The tray is then attached to the bottom of the collector member 10 preferably by adhesives. The layer of foam prevents breakage of the silicon photovoltaic cells 16 and allows room for thermal expansion of the cells 16. The top surface of the silicon photovoltaic cells 16 is in direct contact with the collector member 10. As a result the collector member 10 can conduct heat away from the cells 16 to cool them.

The fins 15 may be of various shapes and sizes and they may also face at different angles to the horizontal, the only constraint being that, taken together, they must concentrate radiation on the photovoltaic cell 16. The fins 15 shown in FIG. 2 include some with curved faces 19. These curved faces 19 concentrate solar radiation in the same manner as a standard lens. The fins 15 may also have faces that are squared, angled or any of a variety of other shapes. The fins 15 shown in FIG. 2 are the preferred embodiment. If one or more fins 15 are changed, removed or angled then some or all of the lower fins 15 may have to be adjusted. This is because a change in a single fin 15 will effect the entire path of solar radiation through the collector. A simple calculation is all that is required to determine how to adjust the fins 15. The preferred ratio of the collecting area to the area of the photovoltaic cells is thirty (30). This represents a balancing of maximum power output against undesirable heating of the system. A greater ratio generates too much heat and thereby decreases the efficiency of the silicon cells 16, and a lesser ratio does not generate as much power.

Figure 3:
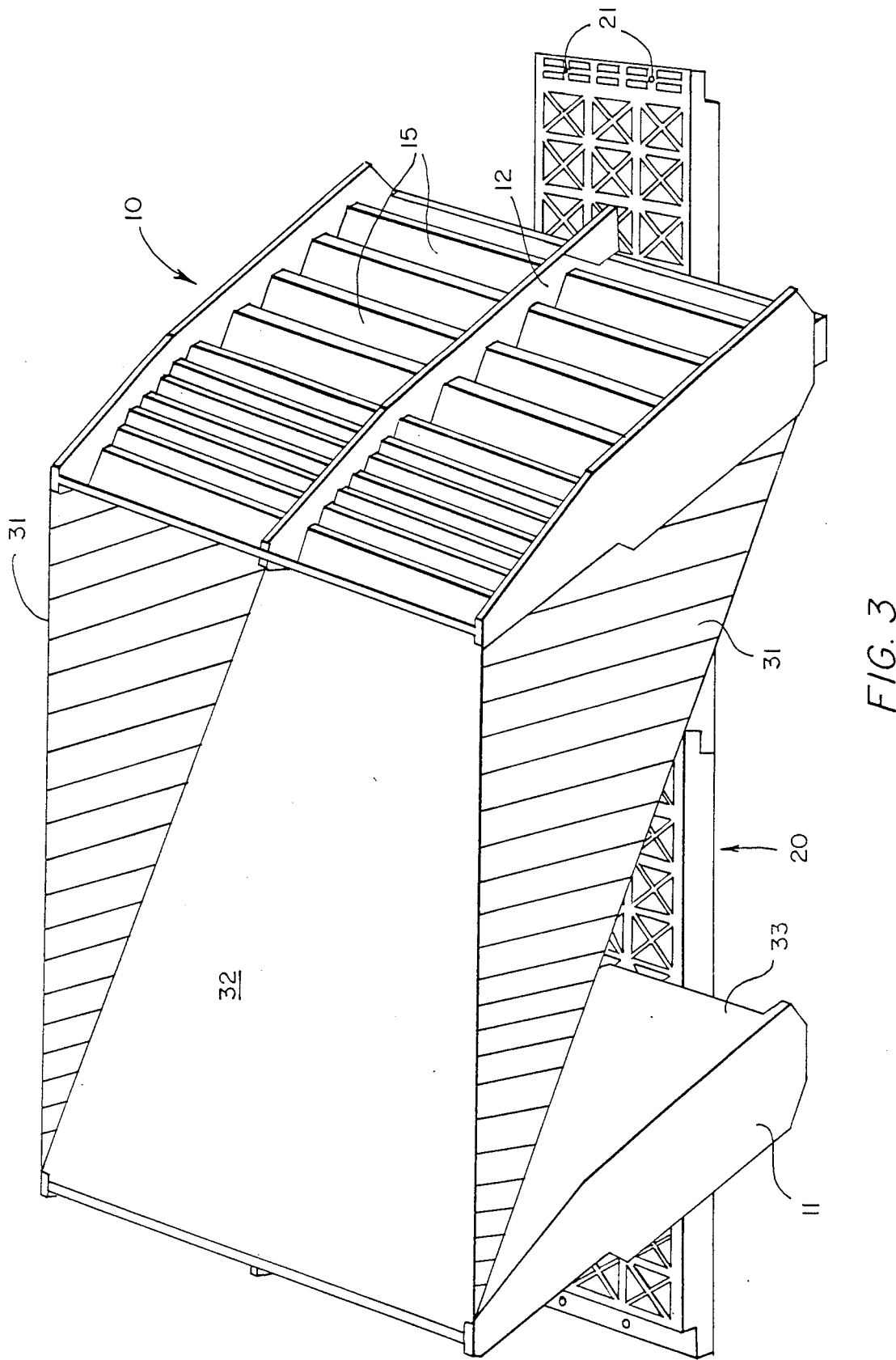
FIG. 3 is a perspective view of two photovoltaic devices from the rear side.
Figure 4:
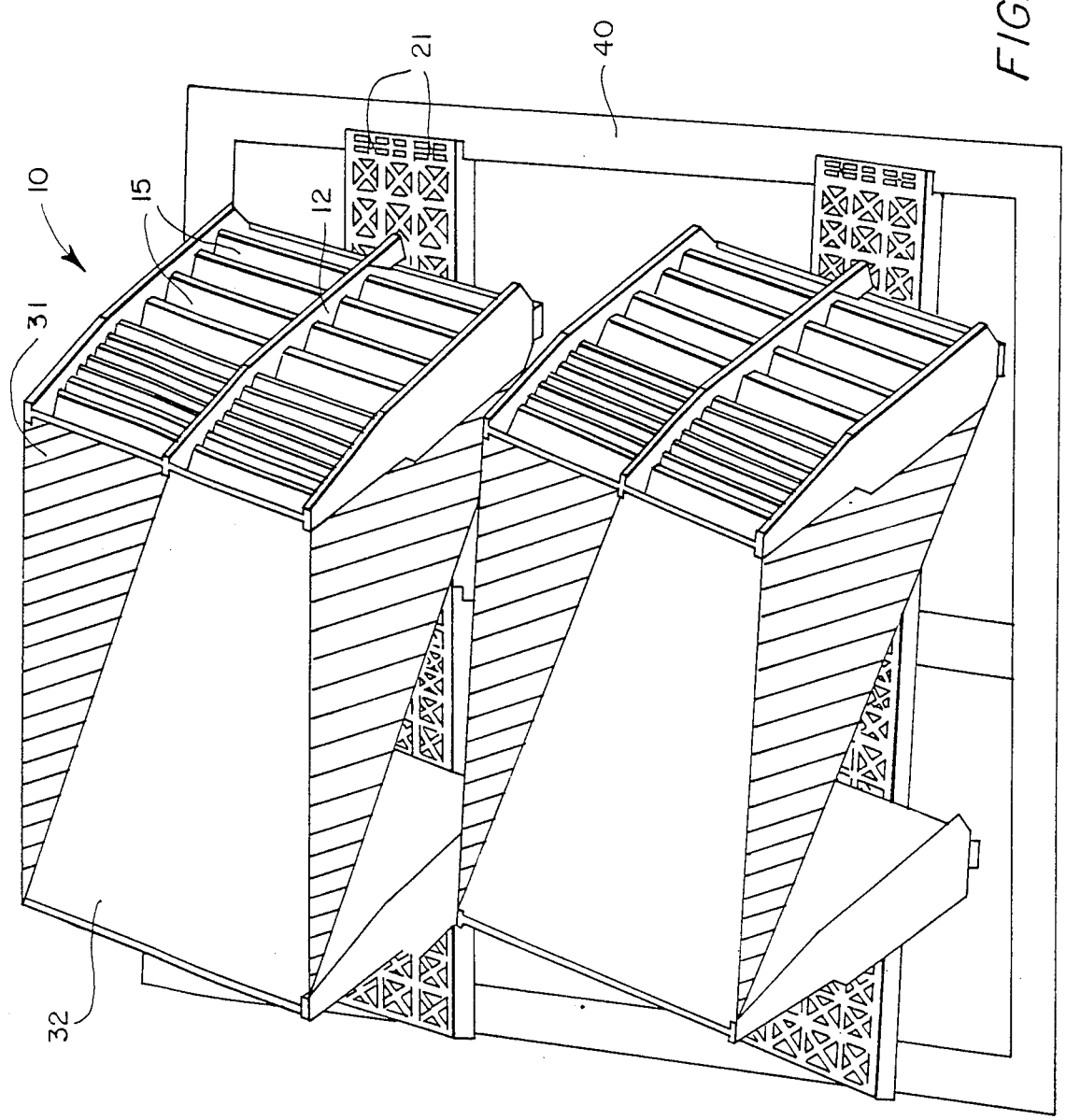
FIG. 4 is a perspective view of four (4) photovoltaic devices mounted on a mounting frame.

Referring now to FIG. 3, a pair of collector members 10 and attachment members 20 are shown including the triangular members 31 and the reflective sheet 32 of the preferred embodiment. The triangular members 31 are connected to the collector members 10 at the top of the side edge 11 of one collector member 10 and at the top and bottom of the side edge 11 of the second collector member 10 as shown in the diagram. These triangular members 31 are designed so that they will refract solar radiation toward the front of the second collector member 10. The triangular members 31 are also designed to refract solar radiation downward. This causes radiation to impinge on the lower part of the front side of the collector member 10, or onto the reflective sheet 32 which will reflect the solar radiation onto the front side of the collector member 10. The reflective sheet 32 also reflects radiation that directly impinges upon it onto the front side of the collector member 10. The combination of the two triangular members 31 and the reflective sheet 32 substantially increase the surface area of the collector 10 by reflecting and refracting radiation that would miss the front side of the collector member 10 thereby causing it to impinge on the front side of the collector member 10. The addition of the triangular members 31 and the reflective sheet 32 increase collection by as much as 20–40%. This increased collection obviates the need for a solar tracking system. The present invention remains passive and still generates a substantial amount of power.

The preferred embodiment also includes a reflective surface 33 which fits over the rear side of the collector member 10. The reflective surface 33 faces towards the fins 15 and prevents the escape of solar radiation from the collector through the rear side.

An operating system of collectors includes approximately twenty five (25) collector members 10 and correspondingly twenty five (25) attachment members 20 for supporting the collector members 10. The collector members 10 may be arranged in a linear fashion or in a series of parallel lines as long as there is adequate space between the collector members 10 to prevent shading of some of the collector members 10 by others. A preferred way of preventing shading is to mount each successive module slightly higher than the previous module to form a step-like arrangement. The attachment members 20 are all preferably attached to an external frame 40 which is pivotally mounted so that the angle of inclination of the collector members 10 may be varied by tilting the external frame 40.

It has been determined that the majority of breakdowns of solar collection systems occur as a result of problems with the electrical wiring. Therefore, the present system employs a separate wiring harness which runs alongside the collector members 10 and attachment members 20. This provides easy access to the wiring for repair and replacement. A separate harness is provided for each collector member 10. Wires are connected to the photovoltaic cells 16 and run along the attachment members 20. The photovoltaic cells 16 are preferably connected in parallel to a single wire harness such that each collector member 10 has only a single output. The entire system is wired to a battery or directly to a device which consumes electricity by connecting the collector members 10 in series. The electrical system includes a blocking diode located just before the battery or device which consumes electricity. This diode allows flow of electricity away from the collector members 10 but will not allow reverse flow when the collector members 10 are not operating. Also, each harness for the individual collector member 10 includes a bypass diode. This allows for flow of electricity past a collector member 10 only if it is not functioning. It also prevents the malfunctioning collector member 10 from drawing electricity from other parts of the system.

The collector members 10 are preferably fabricated from Lexan using standard injection molding techniques. Other clear materials having the refractive properties necessary for this invention, may be used. The attachment members 20 are preferably fabricated from inexpensive lightweight plastics by injection molding. Reground waste plastics such as ABS plastic are the preferred materials. Other materials may be used as long as they exhibit the requisite strength. The preferred attachment members 20 contain 20% fiberglass as a strength reinforcement. The attachment members 20 are preferably white to minimize heat absorbtion. The attachment members 20 act as a heat sink by conducting heat away from the collector members 10. The reflective sheet 32 and the reflective surface 33 that fits over the rear side are preferably fabricated from Mylar, but other reflective materials may be substituted therefor. The triangular members 31 are preferably made from Lexan or another clear material having the requisite refractive properties. All of the Lexan parts are coated with an anti-reflective coating such as argon and an anti-scratch coating such as those that are well known in the art.

The mode of assembly of the present invention has many advantages over the prior art. It can be assembled by any homeowner. To assemble the device an open external frame is mounted on a pivotal mount and then the attachment members 20 are attached end to end to the frame. The attachment members 20 are then attached to each other by screws which fit into the holes 21. The homeowner then takes the collector members 10 and snaps them into the apertures in the attachment members 20. The collector members are releasably attached and may be removed at any time for replacement. The electrical wiring is then connected to connect the photovoltaic cells 16 to a common wire and each collector member 10 is then electrically connected in series or in parallel to the next collector member 10. In the preferred embodiment the photovoltaic cells 16 are connected in parallel and the collector members 10 are connected in series. One collector member 10 is then connected to a battery or to devices that require electricity such as household appliances or electrical outlets. Lastly, the reflective sheet 32 and the reflective surface 33 are attached by adhesives, fasteners or the like and the triangular members 31 are attached to the collector members as shown.

The modular nature of the present invention makes assembly simple. Each collector member 10 is preferably about ten (10) inches tall and weighs about three (3) pounds so that they are easy to handle and are lightweight and inexpensive. Additional collector members 10 may be added to the system at any time simply by installing them in the manner outlined above. Another advantage of the present invention is that if one collector member 10 should be damaged it can easily be replaced. The same is true if a collector member 10 becomes obsolete. A more modern collector member 10 may be installed in place of the old one without requiring new electrical connections or new support structures.

In operation, the user is only required to keep all the surfaces clean, and to face the collector members towards the position of the sun at noon in order to maximize the radiation collected by the collector member 10. The user may also need to adjust the angle of inclination of the external frame as the seasons change although employment of the reflective sheet 32, reflective surface 33 and triangular members 31 of the, preferred embodiment renders this unnecessary.

It will be obvious to one of ordinary skill in the art that many modifications and variations of the present invention are possible in light of the above teachings. It is therefore to be understood that the scope of the invention is to be defined by the claims appended hereto.

I claim:

1. A photovoltaic device for converting solar radiation to electrical energy, comprising a collector member having two side edges, a top end, a bottom end, a front side which comprises a corrugated surface that refracts radiation, a rear side which comprises a plurality of fins protruding outwardly from said collector member, said front and rear sides acting in cooperation to refract and concentrate radiation, and at least one photovoltaic cell being adapted to receive and convert solar radiation to electrical energy mounted at one end of said collector member in a position such that at least some of the radiation refracted and concentrated by said collector member will impinge on said photovoltaic cell.

2. A photovoltaic device as claimed in claim 1 further comprising a reflective surface enclosing said rear side of said collector member to prevent escape of solar radiation from said collector member.

3. A photovoltaic device as claimed in claim 2 further comprising a means for supporting said collector member in a generally upright position.

4. A photovoltaic device as claimed in claim 3 further comprising a second photovoltaic device as claimed in claim 3 and a reflective sheet attached between an aligned pair of said photovoltaic devices, extending from the top of said rear side of a first collector member to the bottom of said front side of a second collector member which reflects solar radiation to said front side of said second collector member.

5. A photovoltaic device as claimed in claim 4 further comprising a pair of substantially triangular members attached between an aligned pair of said photovoltaic devices, said triangular members extending from the top of the side edges of a first collector member to the top and bottom of the side edges of a second collector member, said triangular members being adapted to refract solar radiation impinging thereon in a manner such that at least some of the solar radiation is caused to impinge on said front side of said second collector member.

6. A photovolatic device as claimed in claim 3 wherein said means for supporting comprises:
an external frame, and
a means for attaching at least one of said collector members to said external frame.

7. A photovoltaic device as claimed in claim 1 wherein said front side further comprises a plurality of faces which refract radiation impinging on said faces such that most of the radiation refracted by said first side above the lowest fin impinges on at least one of said fins.

8. A photovoltaic device as claimed in claim 1 wherein at least one of said fins further comprises at least one curved surface which concentrates radiation.

9. A modular apparatus useful for converting solar radiation to electrical energy comprising:
an external frame,
a plurality of attachment members having at least one aperture therein attached to said external frame including means for connecting said collector members to each other,
means for electrically connecting said collector members to each other,
a plurality of photovoltaic devices as claimed in claim 1 wherein said devices further comprise at least one protruding member which fits into said aperture in said attachment members to secure said photovoltaic devices to said attachment members in a releasable manner, and a means for electrically connecting said photovoltaic cells to said collector members in parallel.

10. An apparatus as claimed in claim 9 further comprising a
reflective surface enclosing each of said rear sides of said collector members to prevent escape of solar radiation from said collector members.

11. An apparatus as claimed in claim 10 further comprising a plurality of reflective sheets each of which is attached between an aligned pair of said photovoltaic devices, extending from the tops of said rear sides of first collector members to the bottom of said front sides of second collector members, which reflect solar radiation to said front side of said second collector member.

12. An apparatus as claimed in claim 11 further comprising a plurality of pairs of substantially triangular members each pair being attached between an aligned pair of said photovoltaic devices extending from the tops of said side edges of first collector members to the top and bottom of the side edges of second collector members, said triangular members being adapted to refract solar radiation impinging thereon in a manner such that at least some of the refracted solar radiation is caused to impinge on said front side of said second collector member or on said reflective sheet.

13. An apparatus as claimed in claim 9 wherein said external frame is pivotally mounted.

14. A method of converting solar radiation to electrical energy comprising
mounting at least one photovoltaic device comprising a collector member having two side edges, a top end, a bottom end, a front side which comprises a corrugated surface that refracts radiation, a rear side which comprises a plurality of fins protruding outwardly from said collector member, said front and rear sides acting in cooperation to refract and concentrate radiation, and
at least one photovoltaic cell being adapted to receive and convert solar radiation to electrical energy mounted at one end of said collector member in a position such that at least some of the radiation refracted and concentrated by said collector member will impinge on said photovoltaic cell, in a position wherein solar radiation will impinge upon said front side of said collector member, and
electrically connecting said photovoltaic device to an apparatus which consumes or stores electrical energy.

15. A method as claimed in claim 14 wherein a plurality of said photovoltaic devices are mounted in a position wherein solar radiation will impinge upon said front sides of said collector members further comprising the step of electrically connecting said photovoltaic devices in series.

16. A method as claimed in claim 15 further comprising the step of positioning said photovoltaic devices in a position which substantially maximizes the quantity of solar radiation impinging on said front sides of said collector members.

17. A method as claimed in claim 16 wherein said step of positioning said photovoltaic devices comprises
aiming said front faces of said photovoltaic devices at the approximate position of the sun at approximately noon, and
tilting said front faces of said photovoltaic devices at an angle to the vertical, wherein said angle depends on the season of the year.

18. A method as claimed in claim 17 further comprising thestep of convering said rear side of said collector member with a reflective surface to prevent escape of solar radiation from said collector member.

19. A method as claimed in claim 18 further comprising the step of attaching a reflective sheet between an aligned pair of said photovoltaic devices, which reflects solar radiation to said front side of said second collector member, said sheet being attached to the top of said rear sides of first collector members and to the bottom of said front sides of second collector members.

20. A method as claimed in claim 19 further comprising the step of attaching a pair of substantially triangular members between an aligned pair of said photovoltaic devices, said members being attached to the top of the side edges of first collector members and to the top and bottom of the side edges of second collector members, said triangular members being adapted to refract solar radiation impinging thereon in a manner such that at least some of the solar radiation is caused to impinge on said front faces of said second collector members.

* * * * *